United States Patent
Cabral, Jr. et al.

(10) Patent No.: US 8,431,486 B2
(45) Date of Patent: Apr. 30, 2013

(54) INTERCONNECT STRUCTURE FOR IMPROVED TIME DEPENDENT DIELECTRIC BREAKDOWN

(75) Inventors: Cyril Cabral, Jr., Mahopac, NY (US); Sebastian U. Engelmann, White Plains, NY (US); Benjamin Fletcher, New York, NY (US); Eric A. Joseph, White Plains, NY (US); Satyanarayana V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 12/853,537

(22) Filed: Aug. 10, 2010

(65) Prior Publication Data

US 2012/0038056 A1  Feb. 16, 2012

(51) Int. Cl.
*H01L 21/44* (2006.01)
(52) U.S. Cl.
USPC ............... 438/673; 438/622; 257/E21.582
(58) Field of Classification Search .................. 438/673, 438/622; 257/E21.582
See application file for complete search history.

(56) References Cited

U.S. PATENT DOCUMENTS

| | | | |
|---|---|---|---|
| 4,798,650 A * | 1/1989 | Nakamura et al. | 438/673 |
| 6,033,986 A * | 3/2000 | Itoh | 438/673 |
| 7,262,120 B2 * | 8/2007 | Nam | 438/584 |
| 2005/0142844 A1 * | 6/2005 | Ahn | 438/622 |
| 2008/0199738 A1 | 8/2008 | Perry et al. | |
| 2010/0129731 A1 | 5/2010 | Warrier et al. | |

* cited by examiner

*Primary Examiner* — Steven J Fulk
(74) *Attorney, Agent, or Firm* — Scully, Scott, Murphy & Presser, P.C.; Louis J. Percello, Esq.

(57) ABSTRACT

The present disclosure provides a method of forming an interconnect to an electrical device. In one embodiment, the method of forming an interconnect includes providing a device layer on a substrate, wherein the device layer comprises at least one electrical device, an intralevel dielectric over the at least one electrical device, and a contact that is in electrical communication with the at least one electrical device. An interconnect metal layer is formed on the device layer, and a tantalum-containing etch mask is formed on a portion of the interconnect metal layer. The interconnect metal layer is etched to provide a trapezoid shaped interconnect in communication with the at least one electrical device. The trapezoid shaped interconnect has a first surface that is in contact with the device layer with a greater width than a second surface of the trapezoid shaped interconnect that is in contact with the tantalum-containing etch mask.

19 Claims, 7 Drawing Sheets

INTERCONNECT STRUCTURE FOR IMPROVED TIME DEPENDENT DIELECTRIC BREAKDOWN

BACKGROUND

The present disclosure relates to semiconductor devices and methods of forming interconnects to semiconductor devices.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical.

SUMMARY

The present disclosure provides a method of forming an interconnect to an electrical device. In one embodiment, the method of forming an interconnect includes providing a device layer on a substrate, wherein the device layer comprises at least one electrical device, an intralevel dielectric over the at least one electrical device, and a contact that is in electrical communication with the at least one electrical device. An interconnect metal layer is formed on the device layer, and a tantalum-containing etch mask is formed on a portion of the interconnect metal layer that is over the contact to the at least one electrical device. The interconnect metal layer is etched to provide a trapezoid shaped interconnect to the contact of the at least one electrical device. The trapezoid shaped interconnect has a first surface that is in contact with the device layer with a greater width than a second surface of the trapezoid shaped interconnect that is in contact with the tantalum-containing etch mask.

In another embodiment, a method of forming an interconnect is provided that includes providing a device layer on a substrate. The device layer includes at least one electrical device, an intralevel dielectric over the at least one electrical device, and a contact in electrical communication with the at least one electrical device. A metal seed layer is formed on the device layer, and an interlevel dielectric layer is formed on the metal seed layer. A trapezoid shaped via is formed in the interlevel dielectric layer exposing a first portion of the metal seed layer. The trapezoid shaped via has a first opening at an interface between the interlevel dielectric layer and the metal seed layer with a first width that is greater than a second width of a second opening of the trapezoid shaped via. The second opening of the trapezoid shaped via is opposite the first opening of the trapezoid shaped via. The trapezoid shaped via is filled with an interconnect metal to provide a trapezoid shaped interconnect.

In yet another embodiment, a method of forming an interconnect is provided that includes providing a device layer on a substrate, wherein the device layer includes at least one electrical device, an intralevel dielectric over the at least one electrical device, and a contact in electrical communication with the at least one electrical device. An interlevel dielectric layer is formed on a metal seed layer. A trapezoid shaped via is etched into the interlevel dielectric layer exposing a portion of device layer including the contact. The trapezoid shaped via includes a first opening having a first width at an interface between the interlevel dielectric layer and the device layer that is greater than a second opening of the trapezoid shaped via having a second width. The second opening of the trapezoid shaped via is present at a surface of the interlevel dielectric layer that is opposite the interface of the interlevel dielectric layer and device layer at which the first opening is present. The metal seed layer is formed on sidewalls of the trapezoid shaped via and an exposed portion of the device layer at a base of the first opening of the trapezoid shaped via. The trapezoid shaped via is filled with an interconnect metal to provide a trapezoid shaped interconnect.

In another aspect, an electrical structure is provided that includes a plurality of semiconductor devices having a workfunction ranging from −5.1 eV to 4.0 eV.

Trapezoid shaped interconnects are in electrical communication with each of the plurality of semiconductor devices. The trapezoid shaped interconnects have a base width that is greater than a width of the trapezoid shaped interconnects' upper surface. Adjacent trapezoid shaped interconnects are separated by a pitch ranging from 20 nm to 300 nm.

A low-k dielectric material is present separating the adjacent trapezoid shaped interconnects.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
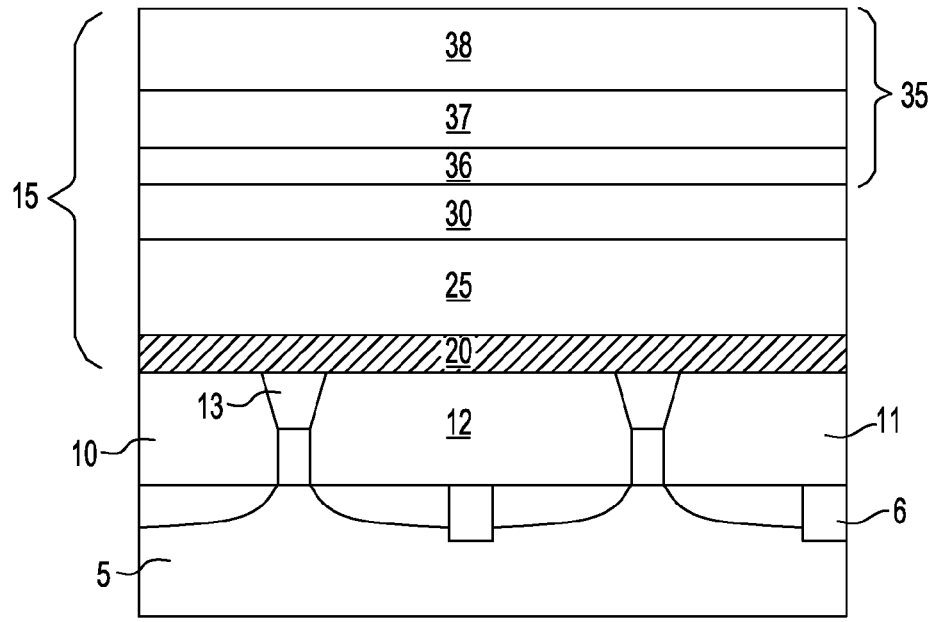
FIG. 1 is a side cross-sectional view depicting a device layer on a semiconductor substrate, and a material stack present on the device layer that includes a barrier metal layer, an interconnect metal layer, a tantalum-containing layer, and a pad dielectric stack, in accordance with one embodiment of the present disclosure.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure decreases the incidence of premature breakdown on insulators between interconnect lines of electrical devices. The term "electrical devices" as used herein is meant to denote semiconductor devices and memory devices, as well as resistors, capacitors, inductors and diodes. The breakdown of dielectrics is typically determined using a time dependent breakdown measurement (TDDB). The time dependent breakdown measurement is a function of the electric field, the distance between adjacent electrically conductive features at their closest point, and the type and quality of the dielectric separating the electrically conductive features.

It has been determined that as the back end of the line (BEOL) interconnects are being scaled, the threshold voltages (Vdd) are not scaling, i.e., not scaling in proportional to the decrease in the dimensions of the back end of the line (BEOL) interconnects. Further, increased scaling leads to smaller pitches, i.e., spacing between adjacent interconnects, and hence less distance between the adjacent sidewalls of the interconnects, along with less tolerance for critical dimensions (CD).

In addition to the requirements of increased scaling, in the current and next generation of high performance electrical devices, there exists a continued need to lessen capacitance. In the interest of reducing capacitance, low dielectric constant (low-k) materials, i.e., materials having a dielectric constant (k) of 4.0 or less, are being selected for the interlevel dielectric layers, which have lower breakdown fields when compared to high dielectric (high-k) materials, i.e., materials having a dielectric constant great than 4.0. The combination of high electric fields, smaller pitches and lower breakdown voltages leads to poor time dependent breakdown (TDDB) measurement reliability.

In a dual damascene (DD) copper integration scheme, the quality of the interlevel dielectric material that is separating the adjacent interconnects is degraded in the upper portion of the line (referred to hereafter as an "interconnect"). Specifically, in a dual damascene (DD) copper integration scheme, the insulating nature of the dielectric material is degraded, which reduces the ability of the interlevel dielectric material to insulate the adjacent interconnects from one another. Examples of processing steps that reduce the insulating nature of the interlevel dielectric include, but are not limited to, reactive ion etching (RIE), chemical mechanical polishing (CMP), pre-cleans for the capping layer and the capping layer interface. The typical cross-sectional geometry of an interconnect produced by a dual damascene integration scheme has a larger width at the upper surface, i.e., top critical dimension (CD), than the width of the lower surface of the interconnect, i.e., bottom critical dimension (CD). The aforementioned geometry for an interconnect structure further degrades time dependent breakdown (TDDB) measurement reliability, because in this geometry the least amount of interlevel dielectric material that is present between the interconnect structures, and the damaged area of the interlevel dielectric material, are both present adjacent to the upper surfaces of the adjacent interconnect structures.

The methods and structures disclosed herein reverse the cross-sectional dimensions of the interconnect, such that the smaller width of the interconnect is present at the upper surface of the interconnect, i.e., top critical dimension, and the larger width of the interconnect is present at the bottom surface of the interconnect, i.e., bottom critical dimension (CD). By increasing the distance between the upper surfaces of adjacent interconnect structures, an increased amount of dielectric material is present between the interconnects. The increased amount of dielectric material that is positioned between the upper surfaces of the adjacent interconnects in present in the region of the interconnect structure at which the process damage occurs that reduces the reliability of the time dependent breakdown (TDDB) measurement. Therefore, by increasing the amount of dielectric material between the upper surfaces of adjacent interconnects, the time dependent breakdown (TDDB) measurement reliability of the structures produced by the present method is increased when compared to interconnect structures having a lesser amount of dielectric material between the upper surfaces of adjacent interconnects.

One possible scheme to implement a trapezoid shaped interconnect having a lesser width at the upper surface of the interconnect than the base surface of the interconnect is a subtractive etch process. One embodiment of a subtractive etch process that provides an interconnect having a base width that is greater than the width of the upper surface of the interconnect is depicted in FIGS. 1-5.

FIG. 1 depicts a device layer 10 on a semiconductor substrate 5, as used in one embodiment of a subtractive etch method for forming an interconnect with increased time dependent breakdown (TDDB) measurement reliability. The semiconductor substrate 5 may be a bulk-semiconductor substrate. In one example, the bulk-semiconductor substrate may be a silicon-containing material. Illustrative examples of Si-containing materials suitable for the bulk-semiconductor substrate include, but are not limited to, Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

Although not depicted in FIG. 1, the semiconductor substrate 5 may also be a semiconductor on insulator (SOI) substrate. In the embodiments in which the semiconductor substrate 5 is an SOI substrate, the semiconductor substrate 5 is typically composed of at least a first semiconductor layer overlying a dielectric layer, i.e., buried dielectric layer, e.g., buried oxide layer. A second semiconductor layer may be present underlying the dielectric layer. The first semiconductor layer and second semiconductor layer may comprise any semiconducting material including, but not limited to, Si, strained Si, SiC, SiGe, SiGeC, Si alloys, Ge, Ge alloys, GaAs, InAs, and InP, or any combination thereof. The dielectric layer that is present underlying the first semiconductor layer and atop the second semiconductor layer may be formed by implanting a high-energy dopant into the semiconductor substrate 5 and then annealing the structure to form a buried oxide layer. In another embodiment, the dielectric layer may be deposited or grown prior to the formation of the first semiconductor layer. In yet another embodiment, the semiconductor on insulator (SOI) substrate may be formed using wafer-bonding techniques, where a bonded wafer pair is formed utilizing a glue, adhesive polymer, or direct bonding.

The semiconductor substrate 5 may include isolation regions 6, such as shallow trench isolation (STI) regions. The STI regions are formed by etching a trench in the semiconductor substrate 5 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

Still referring to FIG. 1, the device layer 10 that is formed on the upper surface of the semiconductor substrate 5 may be provided by front end of the line (FEOL) processing, as used to provide micro-electronic devices, such as semiconductor devices and memory devices. It is noted that the electrical devices included within the device layer 10 and the semiconductor substrate 5 are not limited to devices of a micro-scale, as nano-scale devices are also within the scope of the present disclosure.

A semiconductor device is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor, i.e., p-type or n-type semiconductor. A field effect transistor is one example of a semiconductor device in which output current, i.e., source-drain current, is controlled by the voltage applied to a gate structure. A field effect transistor has three terminals, i.e., gate structure, source and drain. The gate structure is a structure used to control output current, i.e., flow of carriers in the channel, of a semiconducting device, such as a field effect transistor, through electrical or magnetic fields. The channel region is the region between the source and drain of a semiconductor device that becomes conductive when the semiconductor device is turned on. The source region is a doped region in the semiconductor device, in which majority carriers are flowing into the channel. The drain region is the doped region in semiconductor device located at the end of the channel region, in which carriers are flowing out of the semiconductor device through the drain region. In addition to field effect transistors, other semiconductor devices that may be present in the device layer 10 and the semiconductor substrate 5 include bipolar junction transistors (BJT), and schottky barrier type semiconductor devices. In one embodiment, the semiconductor devices that are included in the device layer 10 have a workfunction ranging from −5.1 eV to 4.0 eV.

A memory device is a structure in which the electrical state thereof can be altered and then retained in the altered state, in this way a bit of information can be stored. Examples of memory devices that are suitable for the device layer 10 include dynamic random access memory (DRAM) devices, embedded dynamic random access memory (eDRAM) devices, flash memory devices and combinations thereof. The memory device may include a capacitor that is formed on, or within, the semiconductor substrate 5. A capacitor is a structure including two electrically conductive materials that are separated and insulated from each other by a dielectric for storing a charge. In some examples, the electrically conductive materials of the capacitor are provided by electrode, which are separated by a node dielectric layer. The memory device may also include access transistors.

The above-described semiconductor devices and memory devices are provided for illustrative purposes and are not intended to limit the present disclosure, as any electrical device may be included within the device layer 10. Further examples of electronic devices that are suitable for the device layer 10 include diodes, resistors, capacitors, and inductors. In the example that is depicted in FIG. 1, the device layer 10 includes two semiconductor devices 11, e.g., field effect transistors (FET). Although two semiconductor devices 11 are depicted within the device layer 10, it is noted that the device layer 10 may include any number of devices, e.g., semiconductor devices and/or memory devices.

The device layer 10 may also include an intralevel dielectric 12 over the at least one semiconductor device 11, and a contact 13 that is in electrical communication with the at least one semiconductor device 11. "Electrical communication" as used herein means that the conductivity of the connection between the at least one semiconductor device 11, the contact 13, and the subsequently formed interconnect has a room temperature conductivity of greater than $10^{-8}$ $(\Omega\text{-m})^{-1}$. The pitch of the semiconductor devices typically ranges from 20 to 300.

The intralevel dielectric 12 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the blanket dielectric include: any of the aforementioned materials in porous foam, or in a form that changes during processing to or from being porous and/or permeable to being non-porous and/or non-permeable.

The intralevel dielectric 12 may be formed by various methods including, but not limited to spinning from solution, spraying from solution, chemical vapor deposition (CVD), plasma enhanced CVD (PECVD), sputter deposition, reactive sputter deposition, ion-beam deposition, and evaporation.

The intralevel dielectric 12 is patterned and etched to form via holes to the various semiconductor devices 11 of the device layer 10. Following via formation, contacts 13 are formed by depositing a conductive metal into the via holes using a deposition method, such as CVD or plating. The conductive metal may include, but is not limited to, tungsten, copper, aluminum, silver, gold, and alloys thereof. In another embodiment, when the semiconductor devices 11 that are within the device layer 10 are field effect transistors, metal semiconductor alloy regions, e.g., silicides, may provide the contact to the source, drain and gate structure regions of the field effect transistors.

In one embodiment, the contacts 13 include wiring and vias in electrical communication with the semiconductor devices 11. For example, the subsequently formed trapezoid shaped interconnect is in direct contact with a metal containing via, e.g., tungsten via, in which the metal containing via is in direct contact to the semiconductor devices 11. In one example, a contact material stack may be present between the metal containing via and the semiconductor devices 11. The contact material stack may be composed of a silicide contact in direct contact with the terminals of the semiconductor devices 11, e.g., nickel alloy silicide, and a barrier/adhesion layer that is in direct contact with the silicide contact. The barrier/adhesion layer may be a titanium/titanium nitride bilayer.

Still referring to FIG. 1, in one embodiment, a material stack 15 may be present on the device layer 10 that includes a barrier metal layer 20, an interconnect metal layer 25, a tantalum-containing layer 30, and a pad dielectric stack 35.

The barrier metal layer 20 is typically composed of a metal layer, a metal nitride layer or a combination thereof. The barrier metal layer 20 is typically composed of a material that serves as a diffusion barrier between the device layer 10 and the interconnect metal layer 25. In one embodiment, the barrier metal layer 20 is a metal nitride layer. Examples of metal nitrides that are suitable for the barrier metal layer 20 include tungsten nitride (WN), tungsten silicon nitride (WSiN), titanium nitride (TiN), titanium silicon nitride (TiSiN), tantalum nitride (TaN), tantalum silicon nitride (TaSiN), titanium tantalum nitride (TiTaN), tantalum ruthenium nitride (TaRuN) or combinations thereof. The thickness of the metal nitride layer that provides the barrier metal layer 20 typically ranges from 1.0 nm to 10.0 nm. In another example, the thickness of the metal nitride layer ranges from 2.0 nm to 5.0 nm.

The barrier metal layer 20 may be a multi-layered structure. In one embodiment, the barrier metal layer 20 includes a metal layer and a metal nitride layer. In this embodiment, a metal nitride layer may first be deposited atop the device layer 10, and a metal layer is then deposited atop the metal nitride layer. The metal layer may be titanium (Ti), tantalum (Ta), tungsten (W) or combinations thereof. Similar to the metal nitride layer, the metal layer may have a thickness ranging from 1.0 nm to 10.0 nm. In another embodiment, the metal layer may have a thickness ranging from 2.0 nm to 5.0 nm. In one example, the barrier metal layer 20 is composed of a tantalum (Ta) metal layer, and a tantalum nitride (TaN) metal nitride layer.

The material layers that provide the barrier metal layer 20 may be deposited using physical vapor deposition, e.g., sputtering, or chemical vapor deposition (CVD). Sputtering includes applying high energy particles to strike a solid slab of a target material composed of the material to be deposited, in which the high energy particles physically dislodge atoms of material from the target material to be deposited on at least the device layer 10. In one example, the ion energies of the high-energy particles, e.g., positive ions from an argon gas flow discharge range from 500 eV to 5,000 eV. In another embodiment, the ion energies of the high-energy particles range from 1,500 eV to 4,500 eV.

In one embodiment, in which the barrier metal layer 20 includes a tantalum (Ta)/tantalum nitride (TaN) multi-layered structure, a sputtering deposition process for depositing tantalum (Ta) includes applying high energy particles to strike a solid slab of a tantalum target material, in which the high energy particles physically dislodge atoms of tantalum to be deposited on at the device layer 10. To deposit the tantalum nitride (TaN) layer, the sputtering apparatus may include dual targets, e.g., a first target composed of tantalum and a second target composed of a nitrogen containing materials, or may include a single target composed of tantalum and nitrogen alloyed together. In another embodiment, tantalum nitride is sputtered from a solid tantalum target, in which the nitrogen content of the metal nitride layer is introduced by a nitrogen gas. The sputtered atoms of tantalum and nitrogen typically migrate through a vacuum and deposit on the deposition surface.

An interconnect metal layer 25 may be formed on the upper surface of the barrier metal layer 20. In one embodiment, the interconnect metal layer 25 is in direct contact with the metal layer of the barrier metal layer 20. The interconnect metal layer 25 may be composed of copper (Cu), tungsten (W), aluminum (Al), molybdenum (Mo), ruthenium (Ru), gold (Au), cobalt (Co), nickel (Ni) or combinations thereof. The present disclosure is not limited to the aforementioned compositions, as any metal may be utilized to provide the interconnect metal layer 25, as long as the metal may be etched to provide a trapezoid shaped interconnect having a base width that is greater than the width of the trapezoid shaped interconnect's upper surface. Similar to the barrier metal layer 20, the interconnect metal layer 25 may be deposited using physical vapor deposition, e.g., sputtering, or chemical vapor deposition (CVD). For example, an interconnect metal layer 25 composed of copper may be deposited using sputtering from a copper target. The interconnect metal layer 25 is typically deposited to a thickness ranging from 2.0 nm to 100.0 nm. In another embodiment, the interconnect metal layer 25 may have a thickness ranging from 25 nm to 60 nm. In one embodiment, the interconnect metal layer 25 is composed of copper and is in direct contact with a Ta layer of the barrier metal layer 20.

A tantalum-containing layer 30 is present atop the interconnect metal layer 25. In one embodiment, the tantalum-containing layer 30 provides an etch mask that facilitates etching the interconnect metal layer 25 to form a trapezoid shaped interconnect having a base width that is greater than the width of the trapezoid shaped interconnects' upper surface. In one embodiment, the tantalum-containing layer 30 includes a tantalum content of about 25 wt. % or greater. In another embodiment, the tantalum content of the tantalum-containing layer 30 ranges from 50 wt. % to 100 wt. %. In yet another embodiment, the tantalum content of the tantalum-containing layer 30 ranges from 75 wt. % or 100 wt %. In one example, the tantalum-containing layer 30 is composed of substantially 100% tantalum. By "substantially" it is meant that a tantalum-containing layer 30 that is intended to be 100% tantalum may have incidental impurities that are present therein. By incidental impurities, it is meant that some elements included in the tantalum-containing layer 30 are the result of impurities from processing, such as impurities introduced by the atmosphere.

In some embodiments, the tantalum-containing layer 30 is composed of tantalum (Ta), tantalum nitride (TaN), tantalum silicon nitride (TaSiN), titanium tantalum nitride (TiTaN), tantalum ruthenium nitride (TaRuN) or combinations thereof. In one embodiment, the tantalum-containing layer 30 is deposited into direct contact with the upper surface of the interconnect metal layer 25. The tantalum-containing layer 30 may be deposited using chemical vapor deposition (CVD), a physical vapor deposition (PVD) method, such as sputtering or an atomic layer deposition (ALD). The tantalum-containing layer 30 may have a thickness ranging from 5.0 nm to 100.0 nm. In another embodiment, the tantalum-containing layer 30 may have a thickness ranging from 20 nm to 50 nm.

A pad dielectric stack 35 may be present on the tantalum-containing layer 30. The pad dielectric stack 35 may be a single layer or a multi-layered structure. The pad dielectric stack 35 may be composed of an oxide, nitride or oxynitride material. In one embodiment, the pad dielectric stack 35 is composed of an oxide-containing layer 36 that is present on the upper surface of the tantalum-containing layer 30, a carbon-containing layer 37 (which may be referred to as an organic planarization layer (OPL) that is present on the oxide-containing layer 36, and a photoresist layer 38.

The pad dielectric stack 35 may be formed on the surface of the tantalum-containing layer 30 using deposition and/or thermal growth processes. In one embodiment, the oxide-containing layer 36 is composed of silicon oxide or silicon oxynitride. The silicon oxide may be formed using thermal growth methods, such as thermal oxidation, or chemical vapor deposition (CVD). Chemical Vapor Deposition (CVD) is a deposition process in which a deposited species is formed as a results of chemical reaction between gaseous reactants at an elevated temperature (typically being greater than 200° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others. Other examples of methods for depositing the silicon oxide layer include spinning from solution, spraying from solution, ion-beam deposition, and evaporation. The oxide-containing layer 36 may have a thickness ranging from 5 nm to 100 nm, typically being 25 nm. In one embodiment, the oxide-containing layer 36 is in direct contact with an upper surface of the tantalum-containing layer 30.

The carbon-containing layer 37 may be an organic polymer, such as a polyamide or SiLK™, an organo-inorganic material, such as spin-on glasses and silsesquioxane-based materials, diamond-like carbon (DLC, also known as amorphous hydrogenated carbon, $\alpha$-C:H) or combinations thereof. The carbon-containing layer 37 may also be composed of near frictionless carbon (NFC), anti-reflection coating (ARC) and other organic planarization layers (OPL). The carbon-containing layer 37 may be formed by various methods including, but not limited to, spinning from solution, spraying from solution, chemical vapor deposition (CVD), plasma enhanced CVD (PECVD), sputter deposition, reactive sputter deposition, ion-beam deposition, and evaporation. The carbon-containing layer 37 may have a thickness ranging from 5 nm to 100 nm, typically being 75 nm. In one embodiment, the carbon-containing layer 37 is in direct contact with an upper surface of the oxide-containing layer 36. The photoresist layer 38 is formed on the carbon-containing layer 37. The photoresist layer 38 may be provided by a blanket layer of photoresist material that is formed utilizing a deposition process such as, for example, CVD, PECVD, evaporation or spin-on coating.

Figure 2:
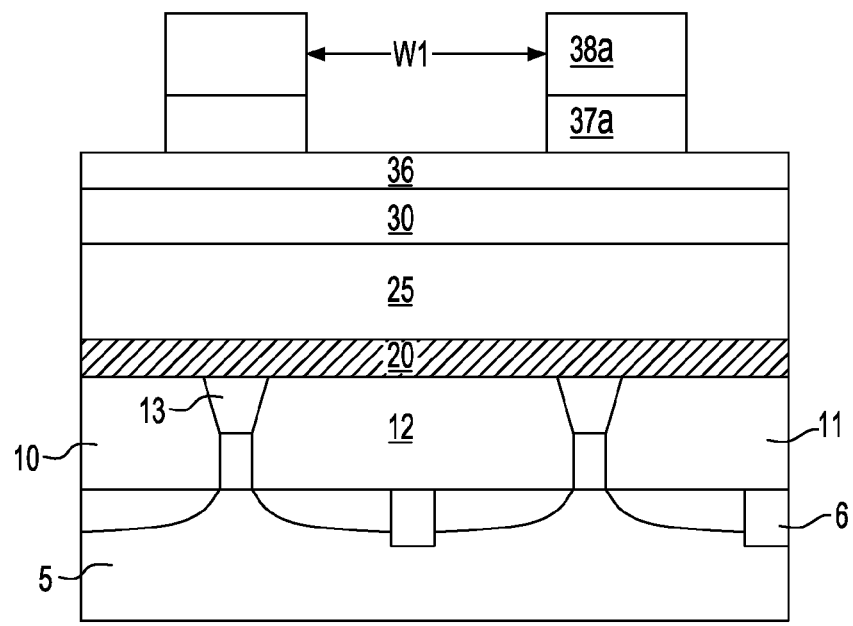
FIG. 2 is a side cross-sectional view depicting etching at least a portion of the pad dielectric stack, in accordance with one embodiment of the present disclosure.
Figure 3:
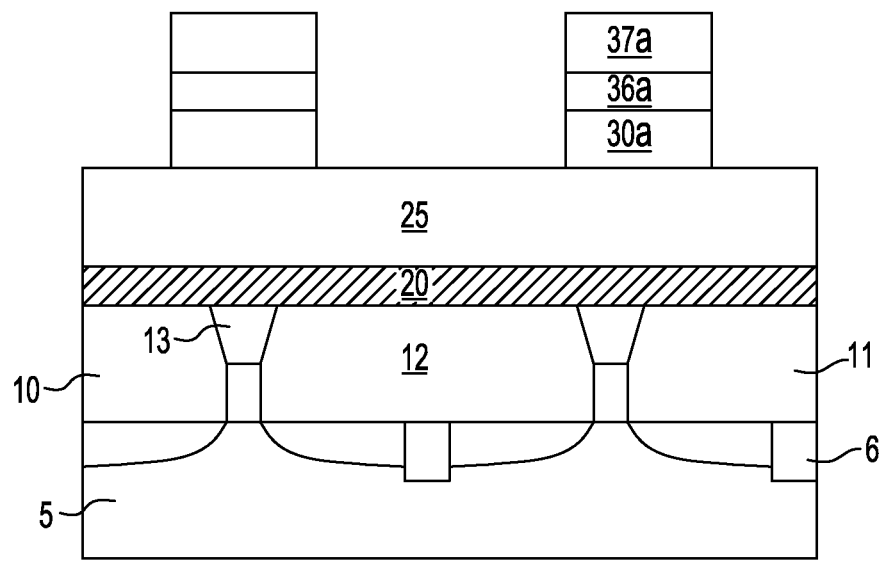
FIG. 3 is a side cross-sectional view depicting forming a tantalum-containing etch mask from the tantalum-containing layer, wherein the tantalum-containing etch mask is present on a portion of the interconnect metal layer that is over a contact to at least one semiconductor device, in accordance with one embodiment of the present disclosure.

Referring to FIG. 2, the photoresist layer 38 is then patterned to provide a photoresist mask 38a utilizing a lithographic process that may include exposing the photoresist layer 38 to a pattern of radiation and developing the exposed photoresist material utilizing a resist developer. The photoresist layer 38 is patterned so that the remaining portions that provide the etch mask are positioned on the portions of the carbon-containing layer 37 that correspond to the subsequently formed trapezoid shaped interconnects. Therefore, the width that separates the remaining portions of the photoresist layer that provides the photoresist mask 38 corresponds to the separation of the upper surfaces of the adjacent trapezoid shaped interconnects. In one embodiment, the width W1 that separates the remaining portions of the photoresist mask that provides the photoresist mask 38a ranges from 12 nm to 300 nm. In another embodiment, the width W1 that separates the remaining portions of the photoresist layer that provides the photoresist mask 38a ranges from 18 nm to 85 nm. In yet another embodiment, the width W1 that separates the remaining portions of the photoresist layer that provides the photoresist mask 38a ranges from 12 nm to 130 nm.

Following the formation of the photoresist mask 38a, an etching process may remove the unprotected portions of the carbon-containing layer 37 selective to the oxide-containing layer 36 of the pad dielectric stack 35. As used herein, the term "selective" in reference to a material removal process denotes that the rate of material removal for a first material is greater than the rate of removal for at least another material of the structure to which the material removal process is being applied. In one example, the transferring of the pattern provided by the photoresist mask 38a through the underlying portions of the pad dielectric stack 35 may include an anisotropic etch. An anisotropic etch process is a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In one embodiment, following the formation of the photoresist mask 38a, a two stage anisotropic etch may be conducted, in which a first selective etch removes the exposed portions of the carbon-containing layer 37. The photoresist mask 38a protects the portion of the carbon-containing layer 37a that is present beneath the photoresist mask 38a from being etched. The first stage of the anisotropic etch may continue until the portion of the carbon-containing layer 37 exposed by the photoresist mask 38a is removed to expose the oxide-containing layer 36. In a second stage of the two stage anisotropic etch, the exposed portions of the oxide-containing layer 36 are removed by an etch chemistry that removes the material of the oxide-containing layer 36 and the underlying tantalum-containing layer 30 selective to the interconnect metal layer 25. The remaining portion of the tantalum-containing layer 30 provides a tantalum-containing etch mask 30a. The tantalum-containing etch mask 30a may be present on a portion of the interconnect metal layer 25 that is over the contact 13 to the at least one semiconductor device 11. During the second stage of the anisotropic etching, the photoresist mask 38a may be removed to provide the structure depicted in FIG. 3. A remaining portion of the oxide-containing layer 36a may be present on an upper surface of the tantalum-containing etch mask 30a.

Figure 4:
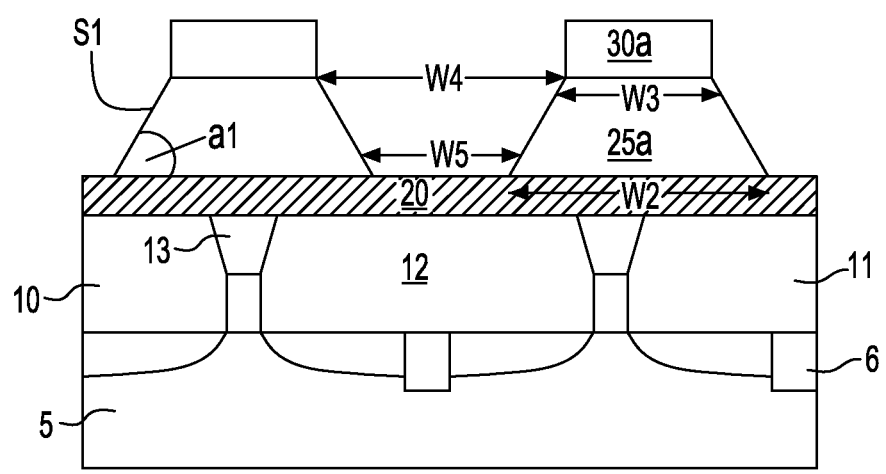
FIG. 4 is a side cross-sectional view depicting etching the interconnect metal layer to provide a trapezoid shaped interconnect to the contact of the at least one semiconductor device, in accordance with one embodiment of the present disclosure.

FIG. 4 depicts etching the interconnect metal layer 25 to provide a trapezoid shaped interconnects 25a that are in electrical communication with the contacts 13 of the semiconductor devices 11. It is noted that although FIG. 4 only depicts two trapezoid shaped interconnects 25a, that the present disclosure may provide any number of interconnect structures to any number of devices, e.g., semiconductor and/or memory devices, that are present in the device layer 10. The term "trapezoid shaped" means a four-sided figure with one pair of parallel sides. In one embodiment, each of the trapezoid shaped interconnect 25a has the geometry of an isosceles trapezoid, in which the non-parallel sides and base angles of the trapezoid are equal. In one embodiment, the angle $\alpha 1$, i.e., sidewall angle $\alpha 1$, at the intersection of the sidewall S1 of the trapezoid shaped interconnect 25a, and the upper surface of the barrier metal layer 20 is greater than 70 degrees. In another embodiment, the trapezoid shaped interconnect 25a has a sidewall angle $\alpha$ that ranges from 70 degrees to 88 degrees. In yet another embodiment, the trapezoid shaped interconnect 25a has a sidewall angle $\alpha$ that ranges from 75 degrees to 85 degrees.

The interconnect metal layer 25 may be etched using reactive ion etch (RIE), in which the anisotropic nature of the etch is controlled by the etch chemistry. The interconnect metal layer 25 is etched with an etch chemistry that removes the material of the interconnect metal layer 25 selective to the tantalum-containing etch mask 30a. In one embodiment, in which the interconnect metal layer 25 is composed of copper, and the tantalum-containing etch mask 30a is composed of tantalum, the etch process that produces the trapezoid shaped interconnect 25a includes a methanol based chemistry. By "methanol based" it is meant that the etch chemistry includes a $CH_3OH$ feed gas. In one example, the methanol based etch chemistry is pure $CH_3OH$. In another example, the methanol based etch chemistry may consist of $CH_3OH$ along with Ar, $O_2$, $NH_3$, $CH_4$, CO, $CO_2$ or a combination thereof. In another example, the methanol based etch process is conducted in a high density plasma chamber with source power ranging from 1000 Watts to 1500 Watts and bias power ranging from 1000 Watts to 1500 Watts.

Referring to FIG. 4, the base of the trapezoid shaped interconnect 25a has a width, i.e., base width W2, that is less than the width W3 at the upper surface of the trapezoid shaped interconnect 25a. In one embodiment, the base width W2 of the trapezoid shaped interconnect 25a ranges from 12 nm to 300 nm. In another embodiment, the base width W2 of the trapezoid shaped interconnect 25a ranges from 18 nm to 85 nm. In yet another embodiment, the base width W2 of the trapezoid shaped interconnect 25a ranges from 12 nm to 130 nm.

The width of the trapezoid shaped interconnect 25a at its' upper surface, i.e., the surface that is in contact with the tantalum-containing etch mask 30a, has a width W3 that ranges from 10 nm to 150 nm. In another embodiment, the upper width W3 of the trapezoid shaped interconnect 25a ranges from 15 nm to 40 nm. In yet another embodiment, the upper width W3 of the trapezoid shaped interconnect 25a ranges from 10 nm to 60 nm.

The trapezoid shaped interconnect 25a allows for a greater amount of dielectric material to be present between the upper surfaces of the adjacent trapezoid shaped interconnects 25a, than between the base surfaces of the adjacent trapezoid shaped interconnects 25a. In one embodiment, the width W4 that is separating the upper surfaces of the adjacent trapezoid shaped interconnects 25a ranges from 12 nm to 300 nm. In another embodiment, the width W4 that is separating the upper surfaces of the adjacent trapezoid shaped interconnects 25a ranges from 18 nm to 85 nm. In yet another embodiment, the width W4 that is separating the upper surfaces of the adjacent trapezoid shaped interconnects 25a ranges from 12 nm to 130 nm.

In one embodiment, the width W5 that is separating the base surfaces of the adjacent trapezoid shaped interconnects 25a ranges from 10 nm to 150 nm. In another embodiment, the width W5 that is separating the base surfaces of the adjacent trapezoid shaped interconnects 25a ranges from 15 nm to 40 nm. In yet another embodiment, the width W5 that is separating the base surfaces of the adjacent trapezoid shaped interconnects 25a ranges from 10 nm to 60 nm.

Figure 5:
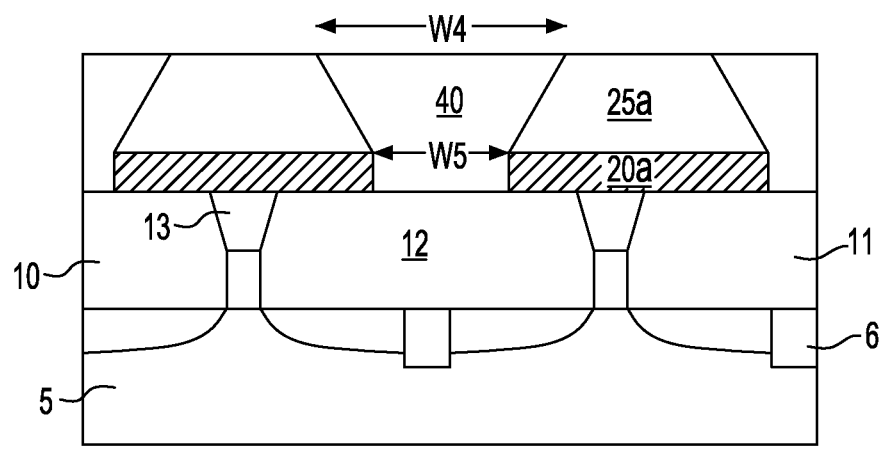
FIG. 5 is a side cross-sectional view depicting etching the barrier metal layer with an anisotropic etch that is selective to the device layer and forming a low-k dielectric layer, in accordance with one embodiment of the present disclosure.

FIG. 5 depicts etching the barrier metal layer 20 with an anisotropic etch that is selective to the device layer 10. In one embodiment, the anisotropic etch process is a reactive ion etch (RIE) process. The barrier metal layer 20 may be removed using the trapezoid shaped interconnects 25a as an etch mask. In one embodiment, the etch chemistry for etching the barrier metal layer 20 removes the material of the barrier metal layer 20 selective to the trapezoid shaped interconnects 25a, and may also remove the tantalum-containing etch mask 30a.

In a following process step, a low-k dielectric material 40 is formed between the trapezoid shaped interconnects 25a. A low-k dielectric material 40 is a dielectric material having a dielectric constant of 4.0 or less, as measured at room temperature (20 to 25° C.). In one embodiment, the low-k dielectric material 40 has a dielectric constant that ranges from 2.0 to 4.0.

One example of a low-k dielectric 40 is silicon oxide. Some examples of other suitable dielectrics that can be used as the dielectric material 40 include, but are not limited to, silsesquioxanes, carbon doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The low-k dielectric 40 material may be deposited using spin on methods, or may be deposited using chemical vapor deposition (CVD). In one embodiment, following deposition, the low-k dielectric 40 is planarized so that the upper surface of the low-k dielectric 40 is coplanar with an upper surface of the trapezoid shaped interconnect 25a.

Because the dimension W4 that is separating the trapezoid shaped interconnects 25a at the upper surface of the trapezoid shaped interconnects 25a is greater than the dimension that is separating the trapezoid shaped interconnects 25a at their base width W5, a greater amount of low-k dielectric material 40 is present at the upper surface of the trapezoid shaped interconnects 25a, when compared to interconnects having a greater width at the upper surface of the interconnect than the base surface of the interconnect. By providing a greater amount of low-k dielectric material at the upper surface of the trapezoid shaped interconnects 25a, the structure is less susceptible to decreases in the reliability of time dependent breakdown measurement (TDDB).

In another aspect of the present disclosure, a trapezoid shaped interconnect 65 is formed using a through mask plating method, as depicted in FIGS. 6-11. In one embodiment, the method includes providing a device layer 10 on a semiconductor substrate 5. In some embodiments, a barrier metal layer 20 is formed in direct contact with an upper surface of the device layer 10. The barrier metal layer 20, the device layer 10 and the semiconductor substrate 5 that are included in this embodiment of the disclosure is similar to the barrier metal layer 20, the device layer 10 and the semiconductor substrate 5 that has been described above with reference to FIG. 1. Therefore, the description of the semiconductor substrate 5 and the device layer 10 that has been described above with reference to FIG. 1 is applicable to the method that is described with reference to FIGS. 6-11.

Figure 6:
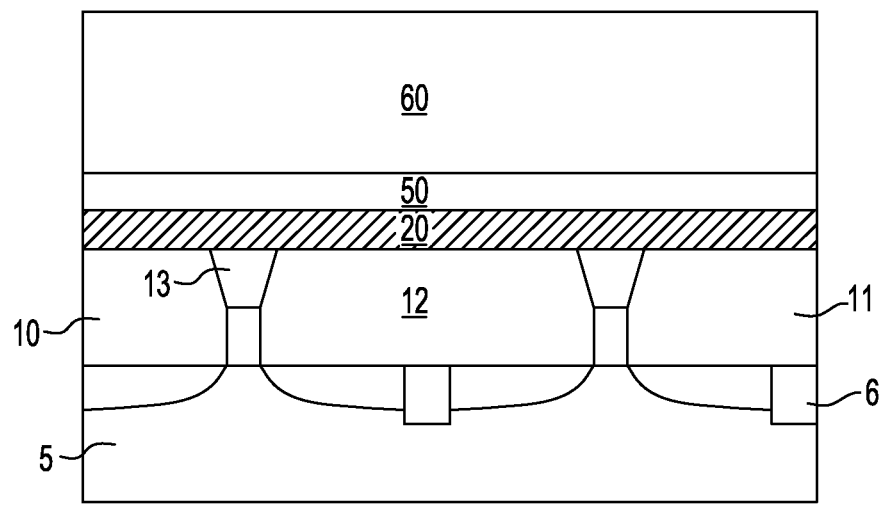
FIG. 6 is a side cross-sectional view depicting a device layer on a semiconductor substrate, a barrier metal layer present on the device layer, a metal seed layer present on the barrier metal layer, and an interlevel dielectric layer present on the metal seed layer, in accordance with one embodiment of the present disclosure.

Still referring to FIG. 6, in this embodiment of the present disclosure, a metal seed layer 50 is formed over the device layer 10. The metal seed layer 50 is typically deposited over the entire width of the device layer 10. In one embodiment, the metal seed layer 50 is deposited in direct contact with the upper surface of the barrier metal layer 20 that is in direct contact with the upper surface of the device layer 10. The metal seed layer 50 is typically composed of the same material as the subsequently formed metal interconnect layer 65. For example, when the metal interconnect layer 65 is composed of copper, the metal seed layer 50 is also composed of copper. In one embodiment, the metal seed layer 50 is deposited by physical vapor deposition (PVD), chemical vapor deposition (CVD) or atomic layer deposition (ALD). In one embodiment, when the metal seed layer 50 is deposited by physical vapor deposition (PVD), the metal seed layer 50 is deposited by sputtering. The metal seed layer 50 may have a thickness ranging from 1 nm to 30 nm. In another embodiment, the metal seed layer 50 may have a thickness ranging from 5 nm to 15 nm. In yet another embodiment, the metal seed layer 50 has a thickness ranging from 8 nm to 12 nm.

Still referring to FIG. 6, an interlevel dielectric layer 60 may be present on the upper surface of the metal seed layer 50. The interlevel dielectric layer 60 is similar to the intralevel dielectric 12 that is described above with reference to FIG. 1. Therefore, the description of the intralevel dielectric 12 that has been described above with reference to FIG. 1 is applicable to the interlevel dielectric layer 60 as used in the method that is described with reference to FIGS. 6-11. In one example, the interlevel dielectric layer 60 is composed of a low-k dielectric.

Figure 7:
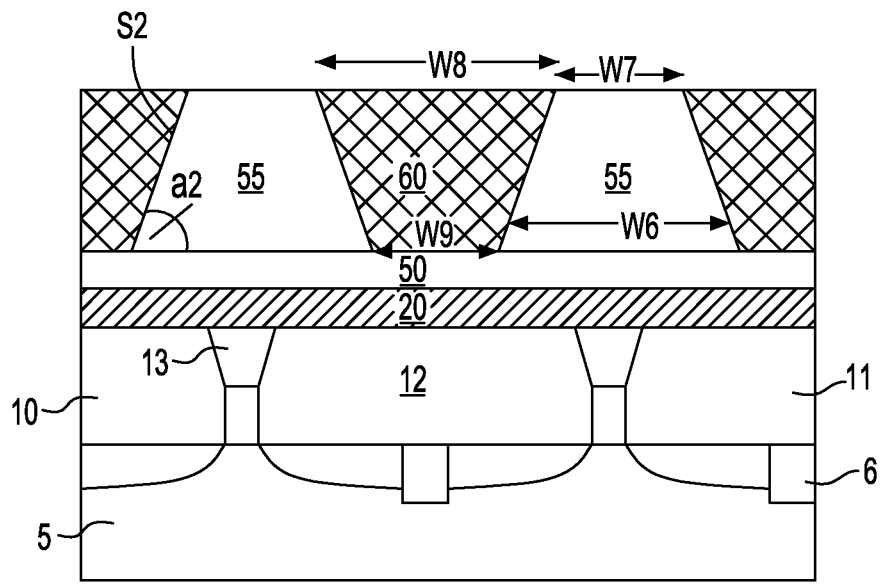
FIG. 7 is a side cross-sectional view depicting forming a trapezoid shaped via in the interlevel dielectric layer exposing a first portion of the metal seed layer, in accordance with one embodiment of the present disclosure.

FIG. 7 depicts one embodiment of forming a trapezoid shaped via 55 in the interlevel dielectric layer 60 exposing a portion of the metal seed layer 50. The term "via" as used to describe the trapezoid shaped via 55 means an opening formed in the dielectric layer 60. It is noted that although FIG. 7 only depicts two trapezoid shaped vias 55, that the present disclosure may provide any number of trapezoid shaped vias 55 to the provide interconnect structures to any number of devices, e.g., semiconductor and/or memory devices, that are present in the device layer 10. In one embodiment, each of the trapezoid shaped vias 55 has the geometry of an isosceles trapezoid, in which the non-parallel sides and base angles of the trapezoid are equal. In one embodiment, the angle α2, i.e., sidewall angle α2, at the intersection of the sidewall S2 of the trapezoid shaped via 55, and the upper surface of the metal seed layer 50 is less that 70 degrees. In another embodiment, the trapezoid shaped via 55 has a sidewall angle α2 that ranges from 70 degrees to 88 degrees. In yet another embodiment, the trapezoid shaped via 55 has a sidewall angle α2 that ranges from 75 degrees to 85 degrees.

The interlevel dielectric layer 60 may be etched using reactive ion etch (RIE), in which the anisotropic nature of the etch is controlled by the etch chemistry. The interlevel dielectric layer 60 is etched with an etch chemistry that removes the material of the interlevel dielectric layer 60 selectively to the metal seed layer 50. In one embodiment, in which the interlevel dielectric layer 60 is composed of $SiO_2$, and the metal seed layer 50 is composed of copper, the etch process that produces the trapezoid shaped via 55 includes a chemistry composed of at least one of $CF_4$, Ar, $CHF_3$, $N_2$ and $O_2$. Other suitable etch chemistries for providing the trapezoid shaped via 55 may also include $NF_3$ and $SF_6$ in addition to $CF_4$, Ar, $CHF_3$, $N_2$ and $O_2$ or combinations thereof.

Referring to FIG. 7, the base of the trapezoid shaped via 55 has a width, i.e., base width W6, that is less than the width W7 at the upper surface of the trapezoid shaped via 55. In one embodiment, the base width W6 of the trapezoid shaped via 55 ranges from 12 nm to 300 nm. In another embodiment, the base width W6 of the trapezoid shaped via 55 ranges from 18 nm to 85 nm. In yet another embodiment, the base width W6 of the trapezoid shaped via 55 ranges from 12 nm to 150 nm.

The width of the trapezoid shaped via at its' upper surface has a width W7 that ranges from 10 nm to 150 nm. In another embodiment, the upper width W7 of the trapezoid shaped via 55 ranges from 15 nm to 40 nm. In yet another embodiment, the upper width W7 of the trapezoid shaped via 55 ranges from 10 nm to 60 nm.

The trapezoid shaped via 55 allows for a greater amount of dielectric material to be present between the upper surfaces of the adjacent trapezoid shaped vias 55, than between the base surfaces of the adjacent trapezoid shaped vias 55. In one embodiment, the width W8 that is separating the upper surfaces of the adjacent trapezoid shaped vias 55 ranges from 12 nm to 300 nm. In another embodiment, the width W8 that is separating the upper surfaces of the adjacent trapezoid shaped vias 55 ranges from 18 nm to 85 nm. In yet another embodiment, the width W8 that is separating the upper surfaces of the adjacent trapezoid shaped vias 55 ranges from 12 nm to 130 nm.

In one embodiment, the width W9 that is separating the base surfaces of the adjacent trapezoid shaped vias 55 ranges from 10 nm to 150 nm. In another embodiment, the width W9 that is separating the base surfaces of the adjacent trapezoid shaped vias 55 ranges from 15 nm to 40 nm. In yet another embodiment, the width W9 that is separating the base surfaces of the adjacent trapezoid shaped vias 55 ranges from 10 nm to 60 nm.

Figure 8:
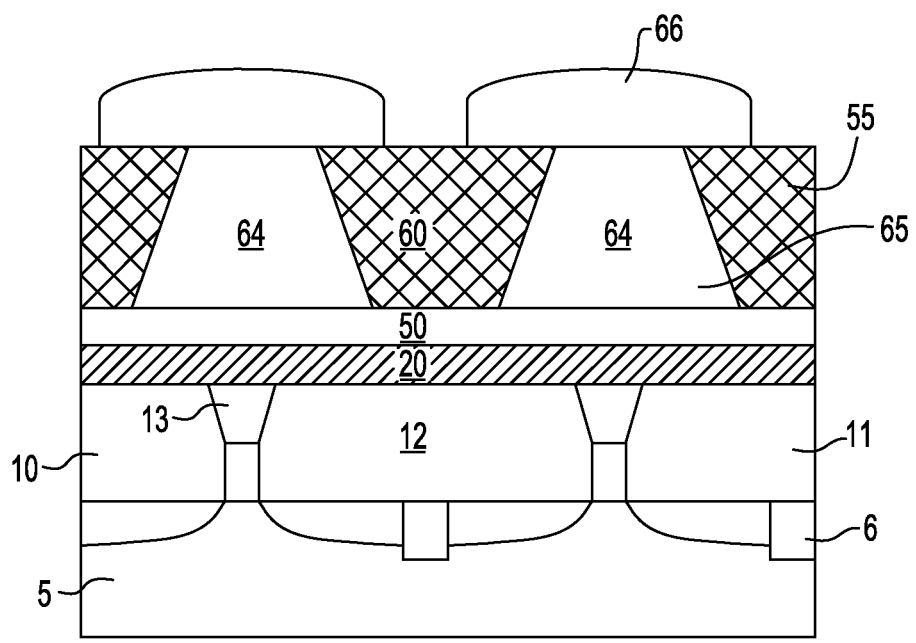
FIG. 8 is a side cross-sectional view depicting filling the trapezoid shaped via with an interconnect metal, in accordance with one embodiment of the present disclosure.

FIG. 8 depicts one embodiment of filling the trapezoid shaped via 55 with an interconnect metal 64. In one embodiment, the interconnect metal 64 has the same composition as the metal seed layer 50. In one embodiment, the interconnect metal 64 is in direct contact with the upper surface of the metal seed layer 50. The interconnect metal 64 may be composed of copper (Cu), gold (Au), cobalt (Co), nickel (Ni) or combinations thereof. The interconnect metal 64 may be deposited using physical vapor deposition (PVD), e.g., sputtering, or chemical vapor deposition (CVD). For example, an interconnect metal 64 composed of copper may be deposited using electroplating from a copper target.

Figure 9:
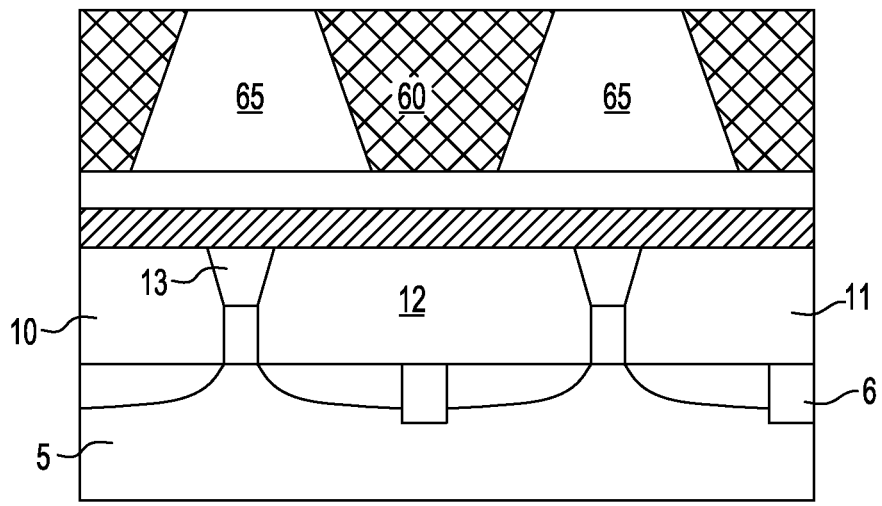
FIG. 9 is a side cross-sectional view depicting planarizing the structure depicted in FIG. 8, in accordance with one embodiment of the present disclosure.

In one embodiment, an overflow portion 66 the interconnect metal 64 is formed outside the trapezoid shaped via 55 on an upper surface of the interlevel dielectric layer 60. The overflow portion 66 may be removed by a planarization process to provide the trapezoid shaped interconnect 65 that is depicted in FIG. 9, in which the upper surface of the trapezoid shaped interconnect 65 is coplanar with the upper surface of the interlevel dielectric layer 60. Planarization is a material removal process that employs at least mechanical forces, such as frictional media, to produce a planar surface. One example of planarization is chemical mechanical planarization (CMP). Chemical mechanical planarization (CMP) is a material removal process using both chemical reactions and mechanical forces to remove material and planarize a surface. The trapezoid shaped interconnect 65 has a geometry and dimensions that are determined by the geometry and dimensions of the trapezoid shaped via 55. Therefore, the dimensions described above with reference to FIG. 7 for the geometry and dimensions of the trapezoid shaped void 55, are equally applicable for the description of the geometry and dimensions of the trapezoid shaped interconnect 65.

Figure 10:
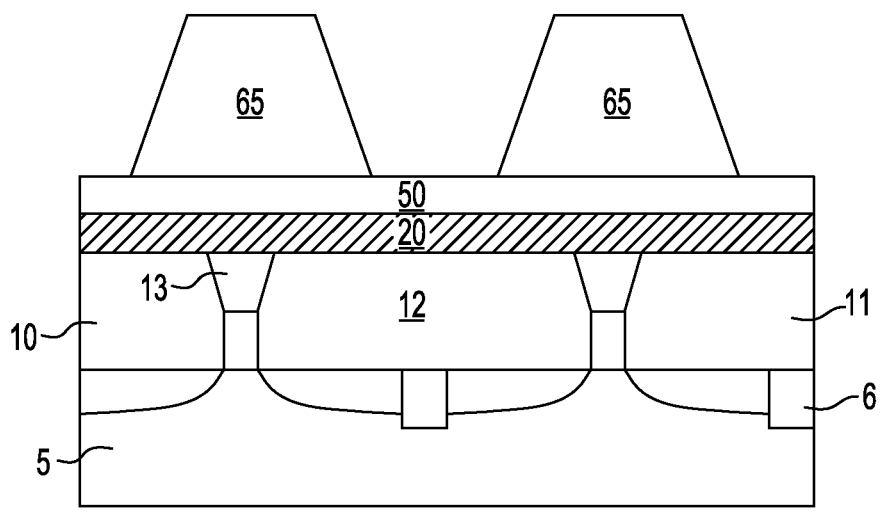
FIG. 10 is a side cross-sectional view removing the interlevel dielectric layer from the structure depicted in FIG. 9, in accordance with one embodiment of the present disclosure.

FIG. 10 depicts removing the interlevel dielectric layer 50. In one embodiment, the interlevel dielectric layer 50 is removed by an etch that is selective to the trapezoid shaped interconnect 65 and the metal seed layer 50.

Figure 11:
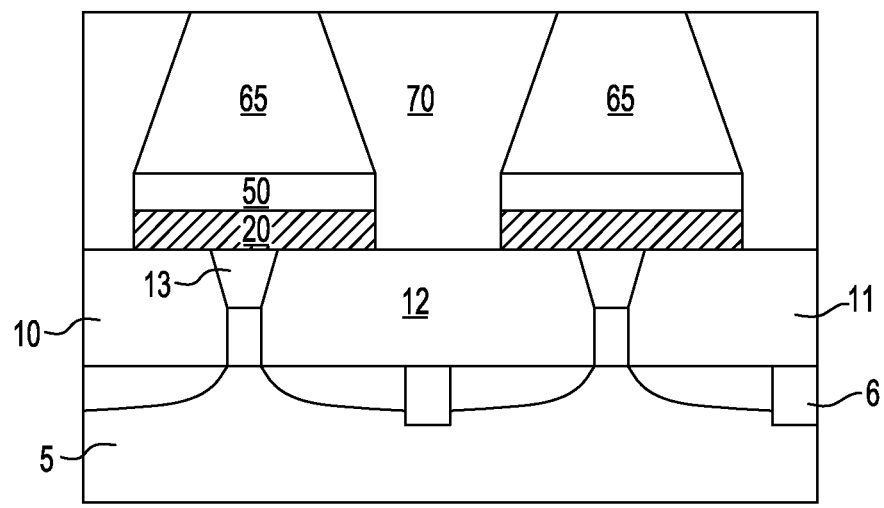
FIG. 11 is a side cross-sectional view depicting etching the barrier metal layer with an anisotropic etch that is selective to the device layer and forming a low-k dielectric layer, in accordance with one embodiment of the present disclosure.

FIG. 11 depicts etching the metal seed layer 50 and the barrier metal layer 20 with an anisotropic etch that is selective to the device layer 10. In one embodiment, the anisotropic etch process is a reactive ion etch (RIE) process. The exposed portions of the metal seed layer 50 and the barrier metal layer 20 may be removed using the trapezoid shaped interconnects 65 as an etch mask. In a following process step, a low-k dielectric material 70 is formed between the trapezoid shaped interconnects 65. The low-k dielectric material 70 that is formed between the trapezoid shaped interconnects 65 that are depicted in FIG. 11 is similar to the low-k dielectric material 40 that is formed between the trapezoid shaped interconnects 25a that are depicted in FIG. 5. Therefore, the description of the low-k dielectric material 40 has been described above with reference to FIG. 5 is applicable to the low-k dielectric material 70 as used in the method that is described with reference to FIGS. 6-11.

By providing a greater amount of low-k dielectric material 70 at the upper surface of the trapezoid shaped interconnects 65, the method illustrated in FIGS. 6-11 provides a structure that is less susceptible to decreases in the reliability of time dependent breakdown measurement (TDDB).

In another aspect of the present disclosure, a trapezoid shaped interconnect 75a is formed using a damascene method, as depicted in FIGS. 12-15. In one embodiment, the method includes providing a device layer 10 on a semiconductor substrate 5. The device layer 10 and the semiconductor substrate 5 that are included in this embodiment of the disclosure is similar to the device layer 10 and the semiconductor substrate 5 that has been described above with reference to FIG. 1. Therefore, the description of the semiconductor substrate 5 and the device layer 10 that has been described above with reference to FIG. 1 is applicable to the method that is described with reference to FIGS. 12-15.

Figure 12:
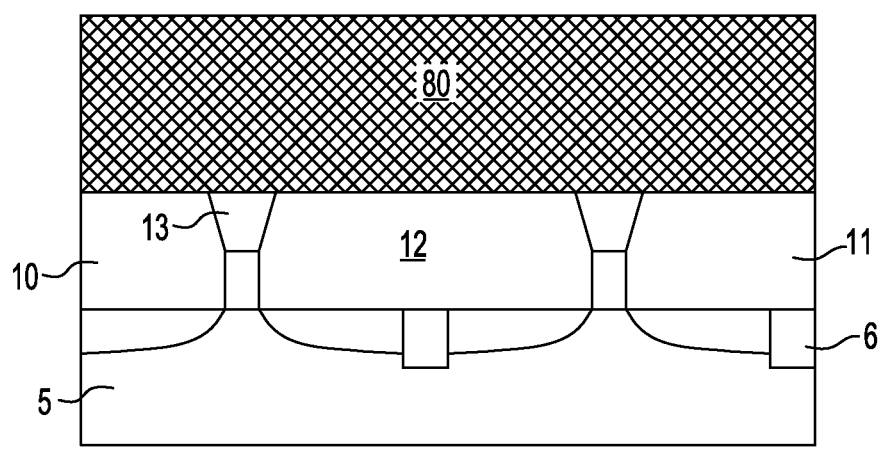
FIG. 12 is a side cross-sectional view depicting a device layer on a semiconductor substrate and a low-k dielectric layer present on the device layer, in accordance with one embodiment of the present disclosure.

Referring to FIG. 12, in one embodiment, a low-k dielectric material 80 is formed on an upper surface of the device layer 10. In one embodiment, the low-k dielectric material 90 has a dielectric constant that ranges from 2.0 to 4.0. One example of a low-k dielectric 80 is silicon oxide. Some examples of other suitable dielectrics that can be used as the low-k dielectric 80 include, but are not limited to, silsesquioxanes, carbon doped oxides (i.e., organosilicates) that include atoms of Si, C, O and H, thermosetting polyarylene ethers, or multilayers thereof. The low-k dielectric 80 may be deposited using spin on methods, or may be deposited using chemical vapor deposition (CVD).

Figure 13:
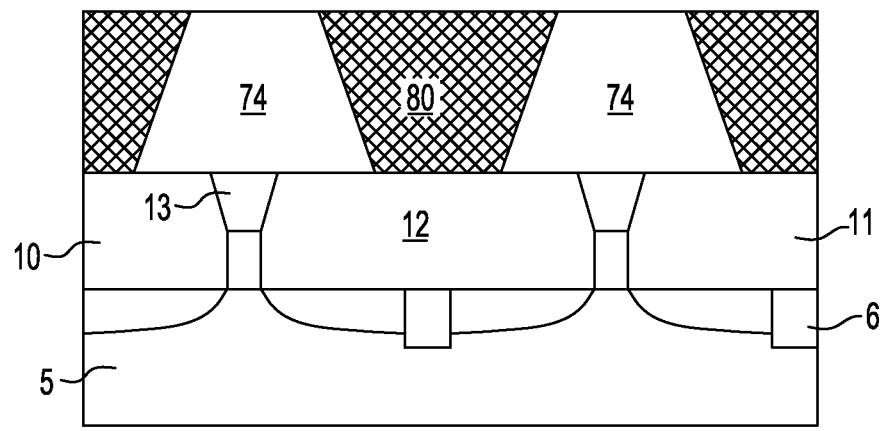
FIG. 13 is a side cross-sectional view depicting forming a trapezoid shaped via in the low-k dielectric layer exposing a first portion of the device layer, in accordance with one embodiment of the present disclosure.

FIG. 13 depicts forming a trapezoid shaped via 74 in the low-k dielectric layer 80 exposing a first portion of the device layer 10. The term "via" as used to describe the trapezoid shaped via 74 means an opening formed in the low-k dielectric layer 80. It is noted that although FIG. 7 only depicts two trapezoid shaped vias 74, that the present disclosure may provide any number of trapezoid shaped vias 74 to the provide interconnect structures to any number of devices, e.g., semiconductor and/or memory devices, that are present in the device layer 10. The trapezoid shaped via 74 has a geometry and dimensions that are similar to the trapezoid shaped via 55 that is described above with reference to FIG. 7. Therefore, the description of the geometry and dimensions of the trapezoid shaped via 55 that has been described above with reference to FIG. 7 is applicable to the trapezoid shaped via 74 that is described with reference to FIG. 13.

The low-k dielectric 80 may be etched to provide the trapezoid shaped via 74 using reactive ion etch (RIE), in which the anisotropic nature of the etch is controlled by the etch chemistry. The low-k dielectric 80 is etched with an etch chemistry that removes the material of the low-k dielectric 80 selectively to the device layer 10. In one embodiment, in which the low-k dielectric 80 is composed of a silicon-containing material or a carbon based low k dielectric, the etch process that produces the trapezoid shaped via 74 includes a chemistry composed of at least one of $CF_4$, Ar, $CHF_3$, and $O_2$. Other suitable etch chemistries for providing the trapezoid shaped via 74 may also include $NF_3$ and $SF_6$ in addition to $CF_4$, Ar, $CHF_3$, $N_2$ and $O_2$, or combinations thereof.

Figure 14:
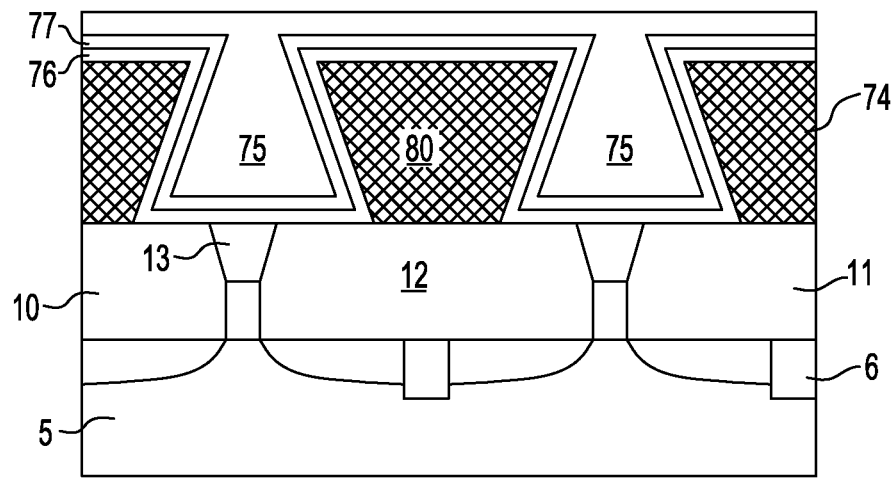
FIG. 14 is a side cross-sectional view depicting forming a metal seed layer on the sidewalls of the trapezoid shaped via and on an exposed portion of the device layer at the base of the trapezoid shaped via, and filling the trapezoid shaped via with an interconnect metal, in accordance with one embodiment of the present disclosure.

FIG. 14 depicts one embodiment of filling the trapezoid shaped via 74 with an interconnect metal 75. In one embodiment, prior to filling the trapezoid shaped via 74 with the interconnect metal 75, a conformal barrier metal layer 76 and a conformal metal seed layer 77 are deposited on the sidewalls of the trapezoid shaped via 74 and the exposed surface of the device layer 10 that is present at the base of the trapezoid shaped via 74. As used herein, "conformal layer" is a deposited material having a thickness that remains the same regardless of the geometry of underlying features on which the layer is deposited, wherein the thickness of the layer does not deviate from greater than or less than 20% of an average value for the thickness of the layer. The composition and thickness of the conformal barrier metal layer 76 is similar to the barrier metal layer 20 that is described above with reference to FIG. 1. Therefore, the description of the composition and thickness of the barrier metal layer 20 that has been described above with reference to FIG. 1 is applicable to the conformal barrier metal layer 76 that is described with reference to FIG. 14.

The composition and thickness of the conformal metal seed layer 77 is similar to the metal seed layer 50 that is describe above with reference to FIG. 6. Therefore, the description of the composition and thickness of the metal seed layer 50 that has been described above with reference to FIG. 6 is applicable to the conformal metal seed layer 77 that is described with reference to FIG. 14. The conformal metal barrier layer 76 and the conformal metal seed layer 77 may each be deposited by chemical vapor deposition (CVD), atomic layer deposition (ALD) or physical vapor deposition, such as sputtering. In one example, the conformal metal seed layer 77 is copper, and the conformal metal barrier layer 76 is a bi-layer composed of a tantalum layer and a tantalum nitride layer.

Figure 15:
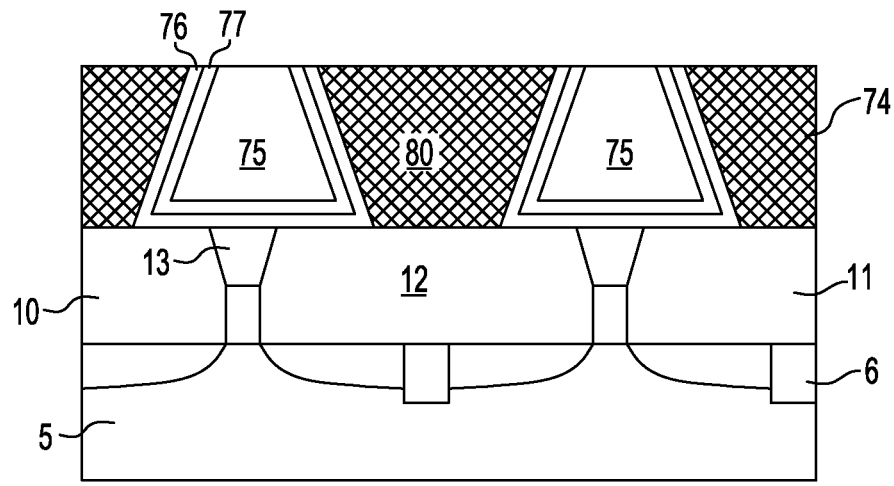
FIG. 15 is a side cross-sectional view depicting planarizing the structure depicted in FIG. 14, in accordance with one embodiment of the present disclosure.

In one embodiment, the interconnect metal 75 has the same composition as the metal seed layer 77. In one embodiment, the interconnect metal 75 is in direct contact with the upper surface of the metal seed layer 77. The interconnect metal 75 may be composed of copper (Cu), gold (Au), cobalt (Co), nickel (Ni) or combinations thereof. The interconnect metal 75 may be deposited using physical vapor deposition, e.g., sputtering, or chemical vapor deposition (CVD). For example, an interconnect metal 64 composed of copper may be deposited using an electroplating solution. The interconnect metal 75 is typically deposited to a fill the trapezoid shaped vias 74. In one embodiment, an overflow portion 76 the interconnect metal 75 is formed outside the trapezoid shaped via 74 on an upper surface of the low-k dielectric 80. The overflow portion 76 may be removed by a planarization process to provide the trapezoid shaped interconnect 75a that is depicted in FIG. 15. The trapezoid shaped interconnect 75a has a geometry and dimensions that are dictated by the geometry and dimensions of the trapezoid shaped via 74 that is described above with reference to FIG. 13. Therefore, the description of the geometry and dimensions of the trapezoid shaped via 74 that has been described above with reference to FIG. 13 is applicable to the trapezoid shaped interconnect 75a that is described with reference to FIG. 15.

By providing a greater amount of low-k dielectric material at the upper surface of the trapezoid shaped interconnects 75, the method illustrated in FIGS. 12-15 provides a structure that is less susceptible to decreases in the reliability of time dependent breakdown (TDDB) measurement.

The above disclosed methods provide an electrical structure having interconnect structures with a trapezoid shaped geometry, in which the base of the interconnect structure has a greater width than an upper surface of the interconnect structure. The interconnect structures are separated by a pitch that ranges from 20 nm to 300 nm. In one embodiment, the interconnect structures are separated by a pitch that ranges from 30 nm to 60 nm. The pitch is a measurement of separation between two adjacent interconnect structures measured from the center of a first interconnect to the center of a second interconnect. The interconnect structures are to semiconductor devices having a work function ranging from −5.1 eV to 4.0 eV. In another embodiment, the threshold voltage of the semiconductor devices ranges from −3.9 eV to 4.9 eV. A low-k dielectric is present between and separating the adjacent interconnect structures, wherein the time dependent breakdown (TDDB) measurement for $V_{max}$ of the low-k dielectric ranges from 1.5 to 3.0 V. In one embodiment, the time dependent breakdown (TDDB) measurement for $V_{max}$ of the low-k dielectric ranges from 0.8 to 2.0 V.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect comprising:
providing a device layer on a substrate, wherein the device layer comprises at least one electrical device, an intra-level dielectric over the at least one electrical device, and a contact in electrical communication with the at least one electrical device;
forming an interconnect metal layer on the device layer;
forming a tantalum-containing etch mask on a portion of the interconnect metal layer that is over the contact to the at least one electrical device; and
etching the interconnect metal layer with a methanol based etch chemistry, wherein the etching forms at least one trapezoid shaped interconnect from the interconnect metal layer that is in electrical communication with the contact of the at least one electrical device, the at least one trapezoid shaped interconnect having a first surface in contact with the device layer with a greater width than a second surface of the at least one trapezoid shaped interconnect that is in contact with the tantalum-containing etch mask.

2. The method of claim 1, wherein the interconnect metal layer is comprised of copper, tungsten, aluminum, molybdenum, ruthenium, gold, cobalt, nickel or combinations thereof.

3. The method of claim 1, wherein prior to forming the interconnect metal layer a barrier metal layer is formed on the device layer.

4. The method of claim 3, wherein the barrier metal layer comprises a tantalum layer that is present on the device layer, and a tantalum nitride layer that is present on the tantalum layer.

5. The method of claim 4, wherein the interconnect metal layer is copper.

6. The method of claim 5, wherein the forming of the tantalum-containing etch mask comprises:
forming a tantalum layer on the interconnect metal layer;
forming a hard mask on the portion of the tantalum layer that is present over the contact to the at least one electrical device; and
etching the tantalum layer selective to the hard mask and the interconnect metal layer, wherein a remaining portion of the tantalum layer provides the tantalum-containing etch mask.

7. The method of claim 6, wherein the etching of the interconnect metal layer to provide the at least one trapezoid shaped interconnect comprises reactive ion etching.

8. The method of claim 7, further comprising etching the barrier metal layer with an anisotropic etch that is selective to the device layer, wherein an etch chemistry for removing the barrier metal layer removes the tantalum-containing etch mask.

9. The method of claim 8, wherein the at least one trapezoid shaped interconnect includes at least two interconnects, wherein the at least two interconnects are separated by a low-k dielectric material.

10. The method of claim 9, wherein the low-k dielectric material is deposited using spin on deposition after the tantalum-containing etch mask has been removed.

11. A method of forming an interconnect comprising:
providing a device layer on a substrate, wherein the device layer comprises at least one electrical device, an intralevel dielectric over the at least one electrical device, and a contact in electrical communication with the at least one electrical device;
forming an interconnect metal layer on the device layer;
forming a tantalum-containing etch mask on a portion of the interconnect metal layer that is over the contact to the at least one electrical device, wherein the forming of the tantalum-containing etch mask comprises forming a tantalum layer on the interconnect metal layer, forming a hard mask on the portion of the tantalum layer that is present over the contact to the at least one electrical device, and etching the tantalum layer selective to the hard mask and the interconnect metal layer, wherein a remaining portion of the tantalum layer provides the tantalum-containing etch mask; and
etching the interconnect metal layer to provide at least one trapezoid shaped interconnect in electrical communication with the contact of the at least one electrical device, the at least one trapezoid shaped interconnect having a first surface in contact with the device layer with a greater width than a second surface of the at least one trapezoid shaped interconnect that is in contact with the tantalum-containing etch mask.

12. The method of claim 11, wherein the etching of the interconnect metal layer to provide the at least one trapezoid shaped interconnect comprises reactive ion etching.

13. The method of claim 12, further comprising etching the barrier metal layer with an anisotropic etch that is selective to the device layer, wherein an etch chemistry for removing the barrier metal layer removes the tantalum-containing etch mask.

14. The method of claim 13, wherein the at least one trapezoid shaped interconnect includes at least two interconnects, wherein the at least two interconnects are separated by a low-k dielectric material.

15. The method of claim 14, wherein the low-k dielectric material is deposited using spin on deposition after the tantalum-containing etch mask has been removed.

16. The method of claim 11, wherein the interconnect metal layer is comprised of copper, tungsten, aluminum, molybdenum, ruthenium, gold, cobalt, nickel or combinations thereof.

17. The method of claim 11, wherein prior to forming the interconnect metal layer a barrier metal layer is formed on the device layer.

18. The method of claim 17, wherein the barrier metal layer comprises a tantalum layer that is present on the device layer, and a tantalum nitride layer that is present on the tantalum layer.

19. The method of claim 18, wherein the interconnect metal layer is copper.

* * * * *